（12） United States Patent
Seki et al.

(10) Patent No.: US 10,243,166 B2
(45) Date of Patent: Mar. 26, 2019

(54) LIGHT-EMITTING DEVICE WITH STACKED LAYERS

(71) Applicants: PIONEER CORPORATION, Tokyo (JP); TOHOKU PIONEER CORPORATION, Yamagata (JP)

(72) Inventors: Shuichi Seki, Yonezawa (JP); Shinsuke Tanaka, Yonezawa (JP)

(73) Assignees: PIONEER CORPORATION, Tokyo (JP); TOHOKU PIONEER CORPORATION, Yamagata (JP)

(*) Notice: Subject to any disclaimer, the term of this patent is extended or adjusted under 35 U.S.C. 154(b) by 0 days.

(21) Appl. No.: 15/551,872

(22) PCT Filed: Feb. 17, 2015

(86) PCT No.: PCT/JP2015/054341
§ 371 (c)(1),
(2) Date: Aug. 17, 2017

(87) PCT Pub. No.: WO2016/132460
PCT Pub. Date: Aug. 25, 2016

(65) Prior Publication Data
US 2018/0040844 A1 Feb. 8, 2018

(51) Int. Cl.
*H01L 51/52* (2006.01)
*H01L 51/50* (2006.01)
*H01L 27/32* (2006.01)

(52) U.S. Cl.
CPC ........ *H01L 51/524* (2013.01); *H01L 27/3244* (2013.01); *H01L 51/50* (2013.01); *H01L 51/5012* (2013.01); *H01L 51/5234* (2013.01)

(58) Field of Classification Search
CPC .................................... H01L 51/524
(Continued)

(56) References Cited

U.S. PATENT DOCUMENTS 5,291,098 A * 3/1994 Okita ............... H05B 33/26
313/498
5,703,436 A * 12/1997 Forrest .............. C09K 11/06
257/E33.056

(Continued)

FOREIGN PATENT DOCUMENTS

JP 2003-168556 A 6/2003
JP 2004-001296 A 1/2004
(Continued)

OTHER PUBLICATIONS

International Search Report and Written Opinion for International Application No. PCT/JP2015/054341 dated Mar. 31, 2015, includes English language translation of the International Search Report (PCT/ISA/210), in 9 pages.
(Continued)

*Primary Examiner* — Caleb E Henry
(74) *Attorney, Agent, or Firm* — Procopio, Cory, Hargreaves & Savitch LLP

(57) ABSTRACT

A substrate (100) includes a resin material. A first stacked film (210) is configured by laminating multiple layers and is formed on a first surface (102) of the substrate (100). A light-emitting unit (140) is formed over the first stacked film (210) and includes an organic layer. A second stacked film (220) is configured by laminating multiple layers and covers the light-emitting unit (140). A third stacked film (310) is configured by laminating multiple layers and is formed on a second surface (104) of the substrate (100). The third stacked film (310) is the same stacked film as the first stacked film (210), and the fourth stacked film (320) is the same stacked film as the second stacked film (220).

6 Claims, 17 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 5,757,139 | A * | 5/1998 | Forrest | G09G 3/14 313/504 |
| 5,917,280 | A * | 6/1999 | Burrows | H01L 27/3209 313/503 |
| 5,982,345 | A * | 11/1999 | Takayama | G09G 3/3216 345/76 |
| 6,188,175 | B1 * | 2/2001 | May | H05B 33/12 257/40 |
| 6,320,322 | B1 * | 11/2001 | Tanaka | G09G 3/3216 315/169.1 |
| 6,566,806 | B1 * | 5/2003 | Kawai | H01L 27/3209 313/501 |
| 6,765,349 | B2 * | 7/2004 | Liao | H01L 51/5221 313/503 |
| 6,872,472 | B2 * | 3/2005 | Liao | H01L 51/5036 257/102 |
| 7,208,872 | B2 | 4/2007 | Miyadera | |
| 7,535,440 | B2 * | 5/2009 | Nishi | H01L 27/3209 345/76 |
| 7,830,089 | B2 * | 11/2010 | Murano | H01L 51/5278 313/504 |
| 8,207,665 | B2 * | 6/2012 | Ibe | H01L 27/3202 313/506 |
| 8,633,585 | B2 | 1/2014 | Schmid et al. | |
| 8,658,442 | B2 | 2/2014 | Schmid et al. | |
| 8,916,397 | B2 | 12/2014 | Schmid et al. | |
| 2002/0084993 | A1 * | 7/2002 | Taneya | G09G 3/2014 345/204 |
| 2003/0170491 | A1 * | 9/2003 | Liao | H01L 51/5036 428/690 |
| 2004/0119400 | A1 * | 6/2004 | Takahashi | C09K 11/02 313/504 |
| 2004/0183067 | A1 * | 9/2004 | Strip | H01L 27/3202 257/40 |
| 2005/0017633 | A1 | 1/2005 | Miyadera | |
| 2005/0029933 | A1 * | 2/2005 | Liao | H01L 51/5036 313/504 |
| 2005/0189875 | A1 * | 9/2005 | Nakada | H01L 27/3209 313/504 |
| 2006/0132026 | A1 * | 6/2006 | Sarma | H01L 51/5088 313/504 |
| 2006/0232992 | A1 * | 10/2006 | Bertram | H01L 27/3202 362/555 |
| 2008/0130278 | A1 * | 6/2008 | Ushikubo | H01L 51/5036 362/231 |
| 2008/0150846 | A1 * | 6/2008 | Chung | G09G 3/3233 345/80 |
| 2009/0242229 | A1 | 10/2009 | Sakai | |
| 2009/0267489 | A1 | 10/2009 | Arita et al. | |
| 2011/0049730 | A1 * | 3/2011 | Schmid | C23C 16/0272 257/787 |
| 2011/0114992 | A1 | 5/2011 | Schmid et al. | |
| 2011/0121354 | A1 | 5/2011 | Schmid et al. | |
| 2014/0117569 | A1 | 5/2014 | Schmid et al. | |
| 2014/0141549 | A1 | 5/2014 | Schmid et al. | |
| 2015/0072451 | A1 | 3/2015 | Schmid et al. | |

FOREIGN PATENT DOCUMENTS

| | | |
|---|---|---|
| JP | 2004-119138 A | 4/2004 |
| JP | 2009-245893 A | 10/2009 |
| JP | 2010-526399 | 7/2010 |
| JP | 2011-517302 A | 6/2011 |
| WO | 2006-067952 A1 | 6/2006 |
| WO | 2008094353 | 8/2008 |

OTHER PUBLICATIONS

Office Action for related JP App No. 2017-500177 dated Jul. 24, 2018, 4 pgs.

* cited by examiner

LIGHT-EMITTING DEVICE WITH STACKED LAYERS

CROSS-REFERENCE TO RELATED APPLICATIONS

This application is a U.S. National Stage entry of PCT Application No. PCT/JP2015/054341, filed on Feb. 17, 2015. The contents of the foregoing are incorporated by reference.

TECHNICAL FIELD

The present invention relates to a light-emitting device.

BACKGROUND ART

In recent years, there has been progress in the development of light-emitting devices having light-emitting units using organic EL (Organic Electroluminescence) elements. The organic EL element is configured of an organic layer interposed between a first electrode and a second electrode. Since the organic layer is easily affected by moisture, oxygen or the like, the light-emitting unit needs to be sealed. One of the ways to seal the light-emitting unit is by using a sealing layer. Ways to form the sealing layer include gas phase film formation methods such as ALD (Atomic Layer Deposition), CVD, sputtering or the like.

Meanwhile, using a resin substrate as a substrate of the organic EL element is being considered. Using the resin substrate allows the light-emitting unit to have flexibility. However, resin materials transmit moisture. When moisture reaches the organic layer of the organic EL element, the organic layer is deteriorated, attributing to the moisture. To avoid such deterioration, forming a gas barrier film over the resin substrate is considered. For example, Patent Document 1 discloses a gas barrier film configured by laminating an inorganic film and a stress relaxation film. The stress relaxation film is formed by an atmospheric plasma treatment. Moreover, Patent Document 1 describes that a sealing film for sealing the organic EL element may be formed in the same way as the gas barrier film.

RELATED ART DOCUMENT

Patent Document

[Patent Document 1]: W/O 2006/067952

SUMMARY OF THE INVENTION

In a case where a substrate is made of resin, as described above, it is necessary to form the gas barrier film. In addition, the sealing film for sealing the organic EL element is also formed over the substrate. Thus, multiple films are formed over a surface of the substrate where the organic EL element is formed. In this case, a stress originated by the multiple films is applied to the substrate, thus increasing the risk of deformation of the substrate.

An example of the problem to be solved by the present invention is to reduce a stress applied to a substrate including a resin material on which an organic EL element is formed.

Means for Solving the Problem

The invention described in claim 1 is a light-emitting device including:

a substrate including a resin material;

a first stacked film formed on a first surface of the substrate and including plural stacked layers;

a light-emitting unit formed on the first stacked film and including an organic layer;

a second stacked film covering the light-emitting unit and including plural stacked layers;

a third stacked film formed on a second surface of the substrate and including plural stacked layers;

a fourth stacked film formed overlapping the third stacked film and including plural stacked layers, in which the number of layers of the third stacked film is the same as that of the first stacked film, and materials of respective ones of the plurality of layers constituting the third stacked film are the same as materials of respective ones of the plurality of layers of the first stacked film positioned in a laminating order corresponding to a laminating order of the third stacked film when counted from the substrate side, and in which the number of layers of the fourth stacked film is the same as that of the second stacked film, and materials of respective ones of the plurality of layers constituting the fourth stacked film are the same as materials of respective ones of the plurality of layers of the fourth stacked film positioned in a laminating order corresponding to a laminating order of the fourth stacked film when counted from the substrate side.

BRIEF DESCRIPTION OF THE DRAWINGS

The objects described above, and other objects, features and advantages are further made apparent by suitable embodiments that will be described below and the following accompanying drawings.

DESCRIPTION OF EMBODIMENT

Figure 1:
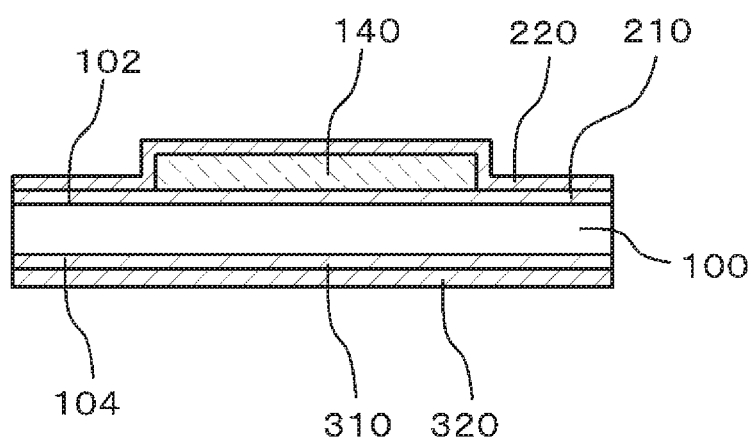
FIG. 1 is a cross-sectional view illustrating a light emitting device according to an embodiment.

Embodiments of the present invention will be described below by referring to the drawings. Moreover, in all the drawings, the same constituent elements are given the same reference numerals, and descriptions thereof will not be repeated.

FIG. 1 is a cross-sectional view illustrating a configuration of a light-emitting device 10 according to an embodiment. The light-emitting device 10 according to the embodiment includes a substrate 100, a light-emitting unit 140, a first stacked film 210, a second stacked film 220, a third stacked film 310, and a fourth stacked film 320. The substrate 100 includes a resin material. The first stacked film 210 is configured of multiple stacked layers and is formed on a first surface 102 of the substrate 100. The light-emitting unit 140 is formed over the first stacked film 210 and includes an organic layer. The second stacked film 220 is configured of multiple stacked layers and covers the light-emitting unit 140. The third stacked film 310 is configured of multiple stacked layers and is formed on a second surface 104 of the substrate 100. The fourth stacked film 320 is configured of multiple stacked layers and is formed overlapping the third stacked film 310. In other words, the third stacked film 310 and the fourth stacked film 320 are formed in this order over the second surface 104. The number of layers in the third stacked film 310 is the same as that of the first stacked film 210, and respective materials of the multiple layers constituting the third stacked film 310 are the same as respective materials of the multiple layers of the first stacked film 210, the layers of the third stacked film 310 and the layers of the first stacked film 210 corresponding in the laminating order when counted from the substrate 100 side. Moreover, the number of layers of the fourth stacked film 320 is the same as that of the second stacked film 220, and respective materials of the multiple layers constituting the fourth stacked film 320 are the same as respective materials of the multiple layers of the second stacked film 220, the layers of the fourth stacked film 320 and the layers of the second stacked film 220 corresponding in the laminating order when counted from the substrate 100 side. A detailed description will be provided below.

The substrate 100 contains a resin material and transmits visible light. The substrate 100 is, for example, a resin substrate, and its thickness is equal to or greater than 10 μm and equal to or less than 1,000 μm. A resin used for the substrate 100 is, for example, PEN (polyethylene naphthalate), PES (polyether sulfone), PET (polyethylene terephthalate), or polyimide.

The light-emitting unit 140 is formed on the first surface 102 of the substrate 100. The light-emitting unit 140 is configured by laminating the first electrode, the organic layer, and the second electrode in this order.

The first electrode is a transparent electrode having optical transparency. Materials of the transparent electrode are those containing a metal, for example, a metal oxide such as ITO (Indium Tin Oxide), IZO (Indium Zinc Oxide), IWZO (Indium Tungsten Zinc Oxide), ZnO (Zinc Oxide) or the like. The thickness of the first electrode is, for example, equal to or greater than 10 nm and equal to or less than 500 nm. The first electrode is formed, for example, by sputtering or vapor deposition. Meanwhile, the first electrode may be formed using a conductive organic material such as carbon nanotubes, PEDOT/PSS or the like.

The organic layer has a light-emitting layer. The organic layer is configured by laminating, for example, a hole injection layer, a light-emitting layer, and an electron injection layer in this order. A hole transporting layer may be formed between the hole injection layer and the light-emitting layer. In addition, an electron transporting layer may be formed between the light-emitting layer and the electron injection layer. The organic layer may be formed by vapor deposition. Further, at least one layer of the organic layer, for example, a layer in contact with the first electrode, may be formed by coating, such as ink jetting, printing, spraying or the like. Meanwhile, in this case, the remaining layers of the organic layer are formed by vapor deposition. Further, all layers of the organic layer may be formed by coating.

The second electrode includes, for example, a metal layer constituted of a metal selected from a first group consisting of Al, Au, Ag (may be Ag ink or Ag nanowires), Pt, Mg, Sn, Zn, and In, or an alloy of metals selected from the first group. In this case, the second electrode has light shielding properties. The thickness of the second electrode is, for example, equal to or greater than 10 nm and equal to or less than 500 nm. However, the second electrode may be formed using a material which was exemplified as the material of the first electrode. The second electrode is formed by, for example, sputtering or vapor deposition.

In addition, the light-emitting unit 140 is sealed using the second stacked film 220. The second stacked film 220 is configured by laminating multiple layers. Each layer configuring the second stacked film 220 is an inorganic film and is formed by ALD (Atomic Layer Deposition).

In addition, the first stacked film 210 is formed on the first surface 102 of the substrate 100, and the third stacked film 310 and the fourth stacked film 320 are formed over the second surface 104 of the substrate 100 in this order. The first stacked film 210, the third stacked film 310, and the fourth stacked film 320 are formed in order to inhibit moisture from permeating the substrate 100, each film being configured of multiple stacked layers. All of the layers are formed by ALD. The first stacked film 210, the second stacked film 220, the third stacked film 310, and the fourth stacked film 320 are formed, for example, of an inorganic film.

Meanwhile, the third stacked film 310 and the first stacked film 210 are formed in the same process. Therefore, the number of layers of the third stacked film 310 and that of the first stacked film 210 are the same, and the respective materials of the multiple layers constituting the third stacked film 310 are the same as the respective materials of the multiple layers of the first stacked film 210, the layers of the third stacked film 310 and the layers of the first stacked film 210 corresponding in the laminating order when counted from the substrate 100 side. Moreover, depending on manufacturing conditions, the third stacked film 310 may have the same configuration as the first stacked film 210, including the thickness of each layer.

Meanwhile, the fourth stacked film 320 and the second stacked film 220 are formed in the same process. Therefore, the number of layers of the fourth stacked film 320 and that of the second stacked film 220 are the same, and the respective materials of the multiple layers constituting the fourth stacked film 320 are the same as the respective materials of the second stacked film 220, the layers of the fourth stacked film 310 and the layers of the second stacked film corresponding in the laminating order when counted from the substrate 100 side. Moreover, depending on manufacturing conditions, the fourth stacked film 320 may have the same configuration as the second stacked film 220, including the thickness of each layer.

Meanwhile, a planarization layer (for example, an organic layer) may be provided between the first surface 102 of the substrate 100 and the first stacked film 210. Moreover, a planarization layer may also be provided between the second surface 104 of the substrate 100 and the third stacked film 310.

Figure 2:
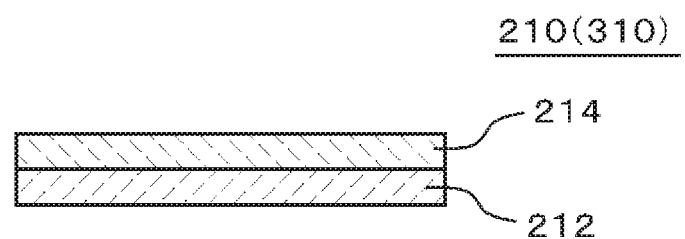
FIG. 2 is a cross-sectional view illustrating a configuration of a first stacked film.

FIG. 2 is a cross-sectional view illustrating a configuration of the first stacked film 210. The first stacked film 210 has a first layer 212 and a second layer 214. The first layer 212 and the second layer 214 are, for example, metal oxide films. Specifically, the first layer 212 is formed using an aluminum oxide (Al2O3), and the second layer 214 is formed using a titanium oxide (TiO2). The thickness of each of the first layer 212 and the second layer 214 is equal to or greater than 3 nm and equal to or less than 10 nm. However, the thickness of each layer is not limited to this range. Also, the first stacked film 210 may be configured by repeatedly laminating the first layer 212 and the second layer 214 in this order. Moreover, the first stacked film 210 may be configured by laminating once or multiple times three layers having materials different from one another.

Meanwhile, as mentioned above, the third stacked film 310 also has a configuration illustrated in FIG. 2.

Figure 3:
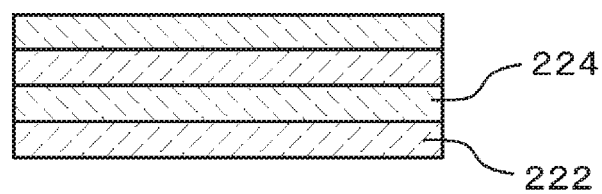
FIG. 3 is a cross-sectional view illustrating a configuration of a second stacked film.

FIG. 3 is a cross-sectional view illustrating a configuration of the second stacked film 220. The second stacked film 220 is configured by repeatedly laminating a first layer 222 and a second layer 224 multiple times. For this reason, the second stacked film 220 is thicker than the first stacked film 210. By making the second stacked film 220 thicker than the first stacked film 210, sealability of the second stacked film 220 is improved. Meanwhile, the first layer 222 is formed using an aluminum oxide (Al2O3), and the second layer 224 is formed using a titanium oxide (TiO2). A titanium oxide has insulating properties under a room temperature condition. However, for example, a titanium oxide obtains conductivity when made into a thin film. Each thickness of the first layer 222 and the second layer 224 is equal to or greater than 3 nm and equal to or less than 10 nm. However, the thickness of these layers is not limited to this range.

Meanwhile, as mentioned above, the fourth stacked film 320 also has a configuration illustrated in FIG. 3.

Figure 4:
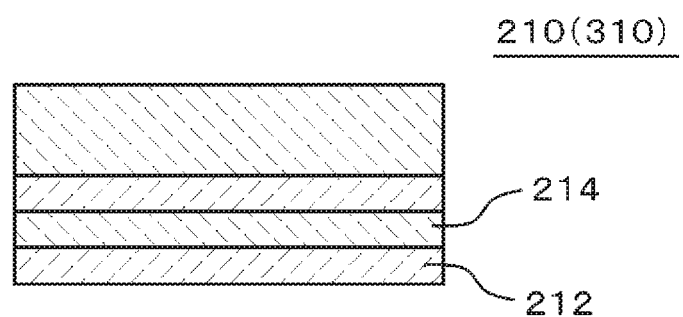
FIG. 4 is a diagram illustrating a configuration of a first stacked film according to Modification Example 1.

FIG. 4 illustrates a configuration of the first stacked film 210 according to Modification Example 1. In the example illustrated in FIG. 4, the first stacked film 210 is configured by repeatedly laminating the first layer 212 and the second layer 214, in this order. Any layer of the first stacked film 210 is thicker compared to other layers configuring the first stacked film 210. In the example illustrated in the drawing, the uppermost layer of the first stacked film 210 (a layer facing the light-emitting unit 140) is thicker compared to the other layers of the first stacked film 210. For example, the thickness of the uppermost layer of the first layer 212 is thicker by four times or more than the thickness of the thickest layer out of the other layers. In addition, the thickness of the first layer 212 is, for example, equal to or greater than 20% and equal to or less than 80% of the thickness of the first stacked film 210.

Meanwhile, in a case where the first stacked film 210 has the configuration shown in FIG. 4, the third stacked film 310 also has the configuration shown in FIG. 4. In this case, a layer of the third stacked film 310 farthest from the second surface 104 of the substrate 100 is thicker compared to the other layers of the third stacked film 310.

Figure 5:
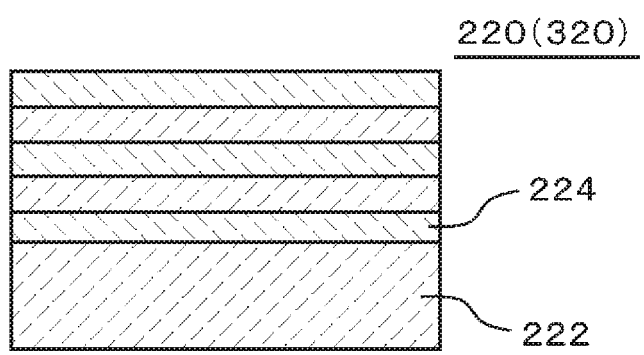
FIG. 5 is a diagram illustrating a configuration of a second stacked film according to Modification Example 1.

FIG. 5 illustrates a configuration of the second stacked film 220 according to Modification Example 1. In the example illustrated in the drawing, the second stacked film 220 is configured by repeatedly laminating the first layer 222 and the second layer 224, in this order. However, since the number of layers of the second stacked film 220 is larger than the number of layers of the first stacked film 210, the second stacked film 220 is thicker than the first stacked film 210. Moreover, any layer of the second stacked film 220 is thicker compared to the other layers configuring the second stacked film 220. In the example illustrated in FIG. 5, the first layer 222 at the bottom (that is, a layer facing the light-emitting unit 140) is thicker compared to the other layers configuring the second stacked film 220. For example, the thickness of the first layer 222 at the bottom is thicker by four times or more than the thickness of the thickest layer out of the other layers. Moreover, the thickness of the first layer 222 is, for example, equal to or greater than 20% and equal to or less than 80% of the thickness of the second stacked film 220.

Meanwhile, in a case where the second stacked film 220 has the configuration illustrated in FIG. 5, the fourth stacked film 320 also has the configuration illustrated in FIG. 5. In this case, a layer of the fourth stacked film 320 closest to the substrate 100 is thicker compared to the other layers of the fourth stacked film 320.

Figure 6:
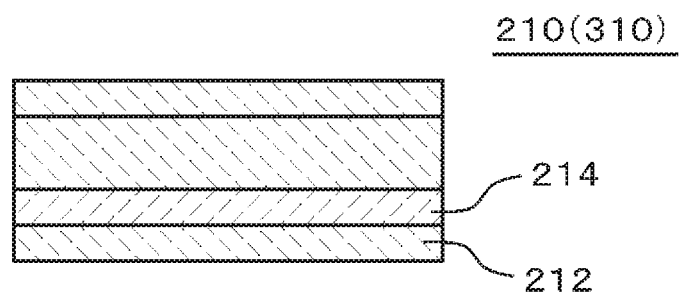
FIG. 6 is a cross-sectional view illustrating a first stacked film according to Modification Example 2.

FIG. 6 is a cross-sectional view illustrating the first stacked film 210 according to Modification Example 2. The first stacked film 210 according to Modification Example 2 has the same configuration as the first stacked film 210 shown in FIG. 4, except that a layer located at the second or higher layer counted from the light-emitting unit 140 side is thicker compared to the other layers of the first stacked film 210. Meanwhile, in a case where the first stacked film 210 has the configuration shown in FIG. 6, the third stacked film 310 also has the configuration shown in FIG. 6.

Figure 7:
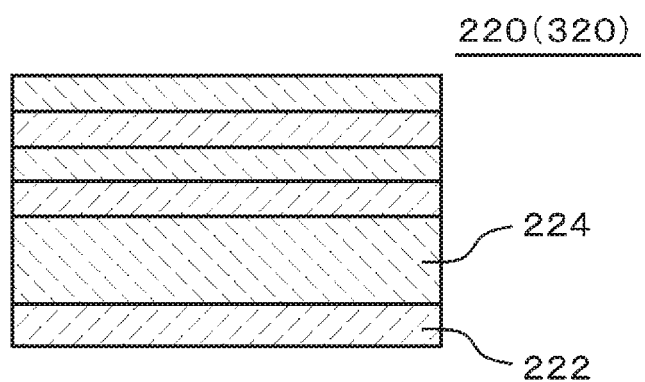
FIG. 7 is a cross-sectional view illustrating a second stacked film according to Modification Example 2.

FIG. 7 is a cross-sectional view illustrating the second stacked film 220 according to Modification Example 2. The second stacked film 220 according to Modification Example 2 has the same configuration as the second stacked film 220 shown in FIG. 5, except that a layer located at the second or higher layer counted from the substrate 100 side is thicker compared to the other layers of the second stacked film 220. Meanwhile, in a case where the second stacked film 220 has the configuration shown in FIG. 7, the fourth stacked film 320 also has the configuration shown in FIG. 7.

Meanwhile, the first stacked film 210 illustrated in FIG. 2 may be used in combination with any second stacked film 220 illustrated in FIG. 3, FIG. 5, and FIG. 7. Moreover, the first stacked film 210 illustrated in FIG. 4 may be used in combination with any second stacked film 220 illustrated in FIG. 3, FIG. 5, and FIG. 7. In addition, the first stacked film 210 illustrated in FIG. 6 may be used in combination with any second stacked film 220 illustrated in FIG. 3, FIG. 5, and FIG. 7.

Figure 17:
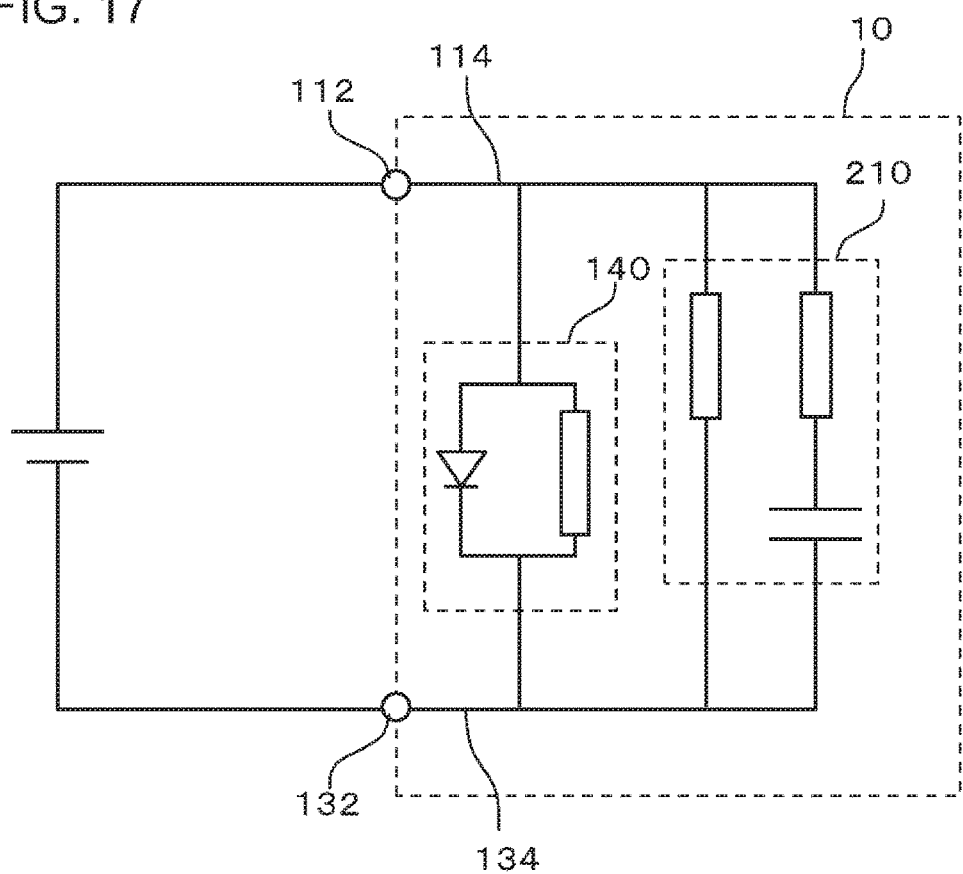
FIG. 17 is an equivalent circuit diagram of a light-emitting device.

FIG. 17 is an equivalent circuit diagram of a light-emitting device 10. In an example shown in the drawing, the light-emitting device 10 has a first terminal 112 and a second terminal 132. The first terminal 112 is connected to the first electrode of the light-emitting unit 140 through an extraction interconnect 114, and the second terminal 132 is connected to the second electrode of the light-emitting unit 140 through an extraction interconnect 134.

When the light-emitting unit 140 of the light-emitting device 10 emits light, voltage is applied between a first extraction interconnect 114 and a second extraction interconnect 134. Further, the first stacked film 210 is in contact with the first extraction interconnect 114 and the second extraction interconnect 134. Moreover, the first stacked film 210 is configured of multiple stacked layers. For this reason, when shown in a equivalency circuit diagram, the first stacked film 210 is configured of a capacitor and a resistance connected in series between the first extraction interconnect 114 and the second extraction interconnect 134. Therefore, an electric current flows into the first stacked film 210 to a certain level, and as a result, when the light-emitting unit 140 emits light, an electric charge is accumulated in the first stacked film 210. This electric charge flows into the light-emitting unit 140 even when voltage is no longer applied between the first extraction interconnect 114 and the second extraction interconnect 134. Due to the flowing electric charge, the response speed is decreased at turning off of the light-emitting unit 140. Moreover, when turning on the light-emitting unit 140, a part of the electric current flows into the first stacked film 210. For this reason, the response speed is also decreased at turning on of the light-emitting unit 140.

In contrast, according to the present embodiment, at least a part of layers in the first stacked film 210 is thicker than the other layers between the first extraction interconnect 114 and the second extraction interconnect 134. For this reason, a resistance value in the equivalent circuit diagram of FIG. 17 is increased. Therefore, an electric current does not easily flow into the first stacked film 210, and as a result, the response speed of the light-emitting unit 140 is hardly decreased. When a layer of the first stacked film 210 closest to the light-emitting unit 140 is made thicker than the other layers, the electric current does not easily flow particularly into the first stacked film 210.

Meanwhile, the description above also applies to the second stacked film 220.

Next, a method of manufacturing the light-emitting device 10 is described. First, the substrate 100 is prepared. Then, for example, using ALD, multiple inorganic layers are formed over the first surface 102 of the substrate 100, thus forming the first stacked film 210 over the first surface 102. Atoms or molecules which become a film through ALD also reach the second surface 104 of the substrate 100. In other words, ALD provides high coatability. Therefore, when forming the first stacked film 210 by ALD, the third stacked film 310 is formed on the second surface 104 of the substrate 100.

Thereafter, a first electrode, an organic layer, and a second electrode of the light-emitting unit 140 are formed over the first stacked film 210 of the substrate 100 in this order, thus forming the light-emitting unit 140. Meanwhile, terminals of the light-emitting unit 140 are also formed by the process.

Next, for example, multiple inorganic layers are formed both on the first stacked film 210 of the substrate 100 and on the light-emitting unit 140 by ALD, thus forming the second stacked film 220 serving as the sealing film on the first surface 102 and the light-emitting unit 140. Also, as mentioned above, ALD provides high coatability. For this reason, when forming the second stacked film 220 by ALD, the fourth stacked film 320 is formed on the second surface 104 of the substrate 100.

As explained above, according to the present embodiment, the first stacked film 210 and the second stacked film 220 are formed on the first surface 102 side of the substrate 100, and the third stacked film 310 and the fourth stacked film 320 are formed on the second surface 104 side of the substrate 100. The number of layers of the third stacked film 210 is the same as that of the third stacked film 310, and materials of respective ones of the multiple layers constituting the third stacked film 310 are the same as materials of respective ones of the multiple layers of the first stacked film 210, the layers of the third stacked film and the layers of the third stacked film corresponding in the laminating order when counted from the substrate 100 side. Further, the number of layers of the fourth stacked film 320 is the same as that the second stacked film 220, and materials of respective ones of the plural layers constituting the fourth stacked film 320 are the same as materials of respective ones of the plural of layers of the second stacked film 220, the layers of the fourth stacked film and the layers of the second stacked film corresponding in the laminating order when counted from the substrate 100 side. Thereby, a stress originated in the first stacked film 210 and applied to the substrate 100 is canceled by a stress originated in the third stacked film 310 and applied to the substrate 100. Moreover, a stress originated in the second stacked film 220 and applied to the substrate 100 is canceled by a stress originated in the fourth stacked film 320 and applied to the substrate 100. Consequently, the stress applied to the substrate 100 is reduced.

Particularly in the present embodiment, since the first stacked film 210 and the third stacked film 310 are formed simultaneously by ALD, configurations thereof become the same as each other. Further, since the second stacked film 220 and the fourth stacked film 320 are formed simultaneously by ALD, configurations thereof become the same as each other. Consequently, the stress applied to the substrate 100 is particularly reduced.

Meanwhile, since the fourth stacked film 320 functions as a barrier film of the substrate 100, the risk of moisture permeating the substrate 100 is further reduced.

Example 1

Figure 8:
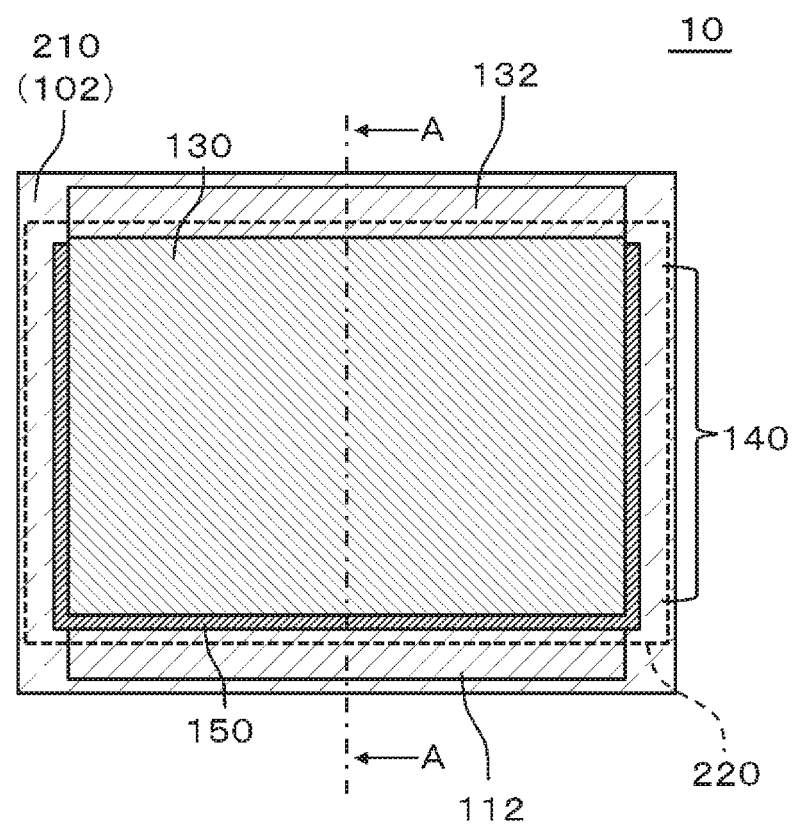
FIG. 8 is a plan view illustrating a configuration of a light emitting device according to Example 1.
Figure 9:
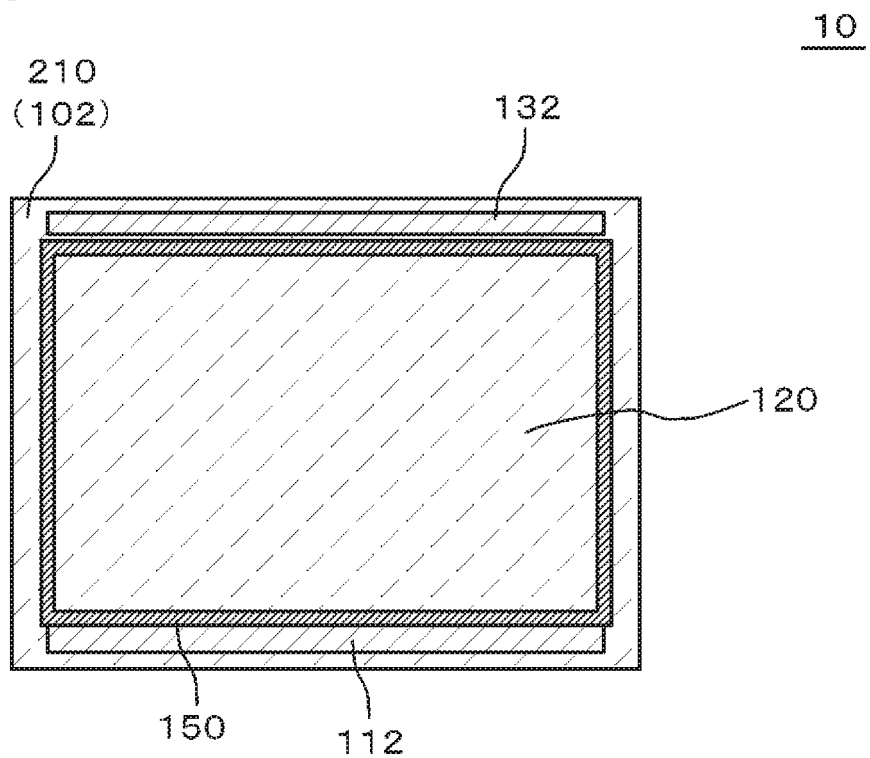
FIG. 9 is a diagram in which a second electrode and a second stacked film are removed from FIG. 8.
Figure 10:
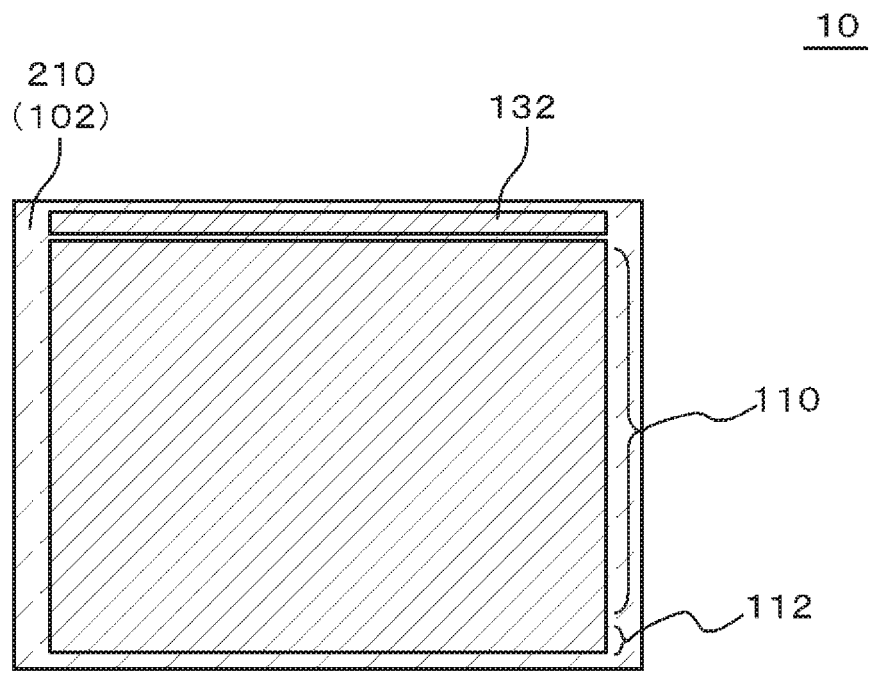
FIG. 10 is a diagram in which an organic layer and an insulating layer are removed from FIG. 9.
Figure 11:
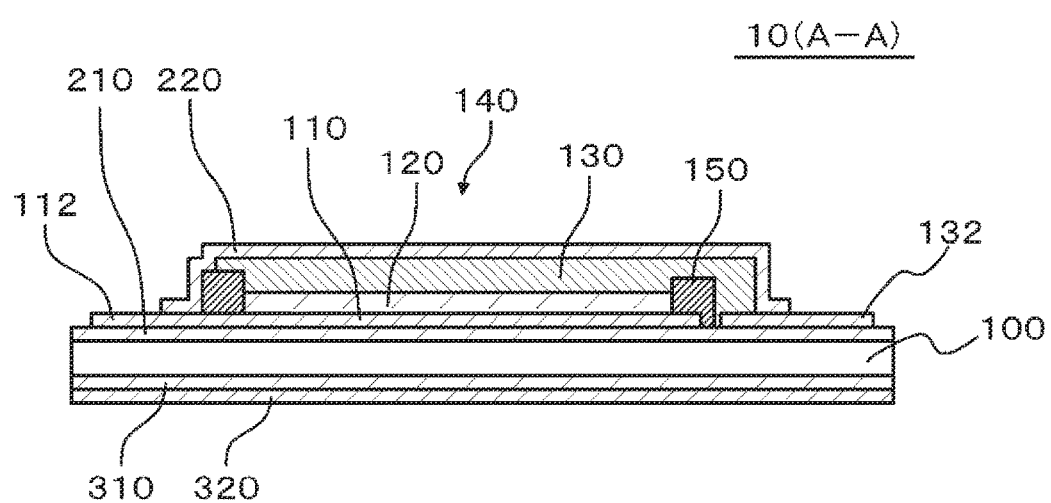
FIG. 11 is a cross-sectional view taken along line A-A of FIG. 8.

FIG. 8 is a plan view illustrating a configuration of a light-emitting device 10 according to Example 1. A second stacked film 220 is indicated by a dotted line in FIG. 8 for ease of explanation. FIG. 9 is a diagram in which a second electrode 130 and the second stacked film 220 are removed from FIG. 8. FIG. 10 is a diagram in which an organic layer 120 and an insulating layer 150 are removed from FIG. 9. FIG. 11 is a cross-sectional view along line A-A of FIG. 8.

In Example 1, the light-emitting device 10 is an illumination device and includes a substrate 100 and a light-emitting unit 140. The light-emitting unit 140 includes a first electrode 110, an organic layer 120, and a second electrode 130. Configurations of the first electrode 110, the organic layer 120, and the second electrode 130 are as described in the embodiment.

An edge of the first electrode 110 is covered by the insulating layer 150. The insulating layer 150 is formed of a photosensitive resin material, for example, a polyimide or the like and surrounds a portion of the first electrode 110 serving as a light-emitting region of the light-emitting unit 140. By providing the insulating layer 150, it is possible to inhibit the first electrode 110 and the second electrode 130 from being short-circuited at the edge of the first electrode 110. The insulating layer 150 is formed, for example, by coating a resin material serving as the insulating layer 150, and then exposing and developing the resin material.

Moreover, the light-emitting device 10 has a first terminal 112 and a second terminal 132. The first terminal 112 is connected to the first electrode 110, and the second terminal 132 is connected to the second electrode 130. The first terminal 112 and the second terminal 132 include a layer formed of the same material as that of the first electrode, for example. Meanwhile, an extraction interconnect may be provided between the first terminal 112 and the first electrode 110. Further, an extraction interconnect may be provided between the second terminal 132 and the second electrode 130.

In addition, the light-emitting device 10 has a first stacked film 210, a second stacked film 220, a third stacked film 310, and a fourth stacked film 320. Configurations of the stacked films and the substrate 100 are as described in the embodiment.

Next, a method of manufacturing the light-emitting device 10 is described. First, the first stacked film 210 and the third stacked film 310 are formed on the substrate 100. Then, the first electrode 110 is formed on the first stacked film 210, thereby also forming the first terminal 112 and the second terminal 132. Then, the insulating layer 150, the organic layer 120, and the second electrode 130 are formed in this order. Thereafter, the second stacked film 220 and the fourth stacked film 320 are formed.

According to the present example, as is the case with the embodiment, stress applied to the substrate 100 may be reduced in the illumination device that uses the light-emitting unit 140.

Example 2

Figure 12:
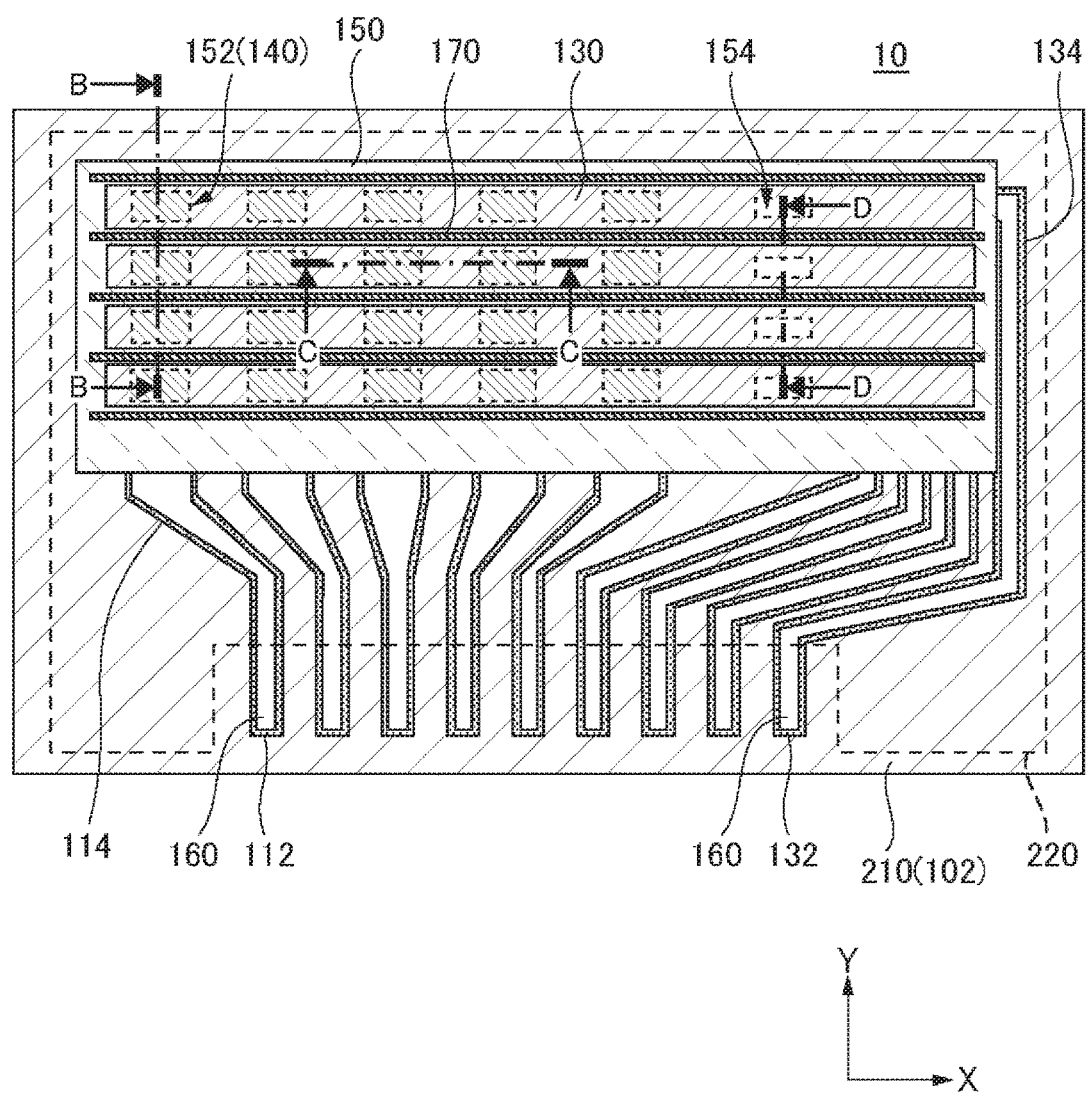
FIG. 12 is a plan view of a light emitting device according to Example 2.
Figure 13:
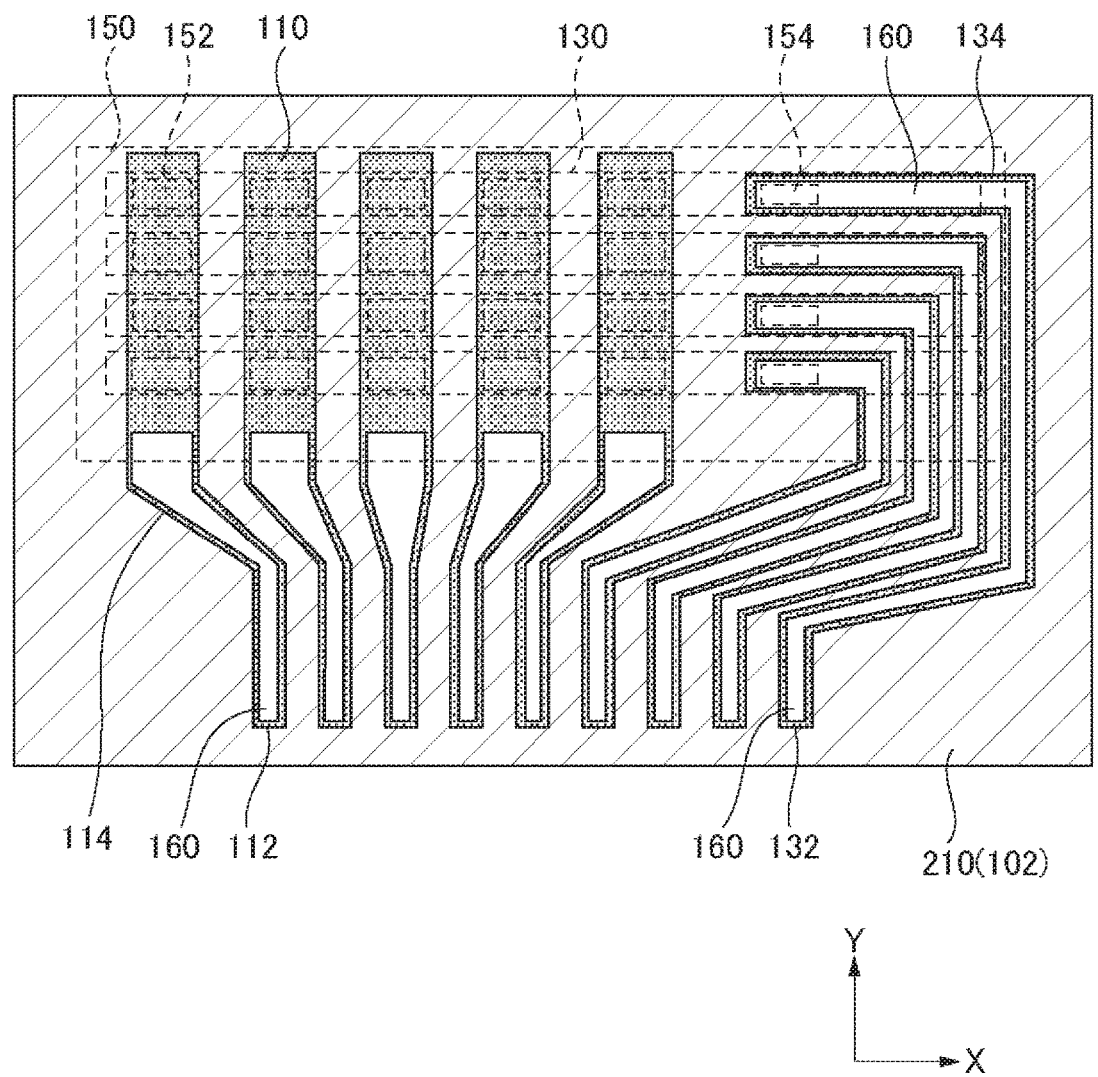
FIG. 13 is a diagram in which a partition wall, a second electrode, and an insulating layer are removed from FIG. 12.
Figure 14:
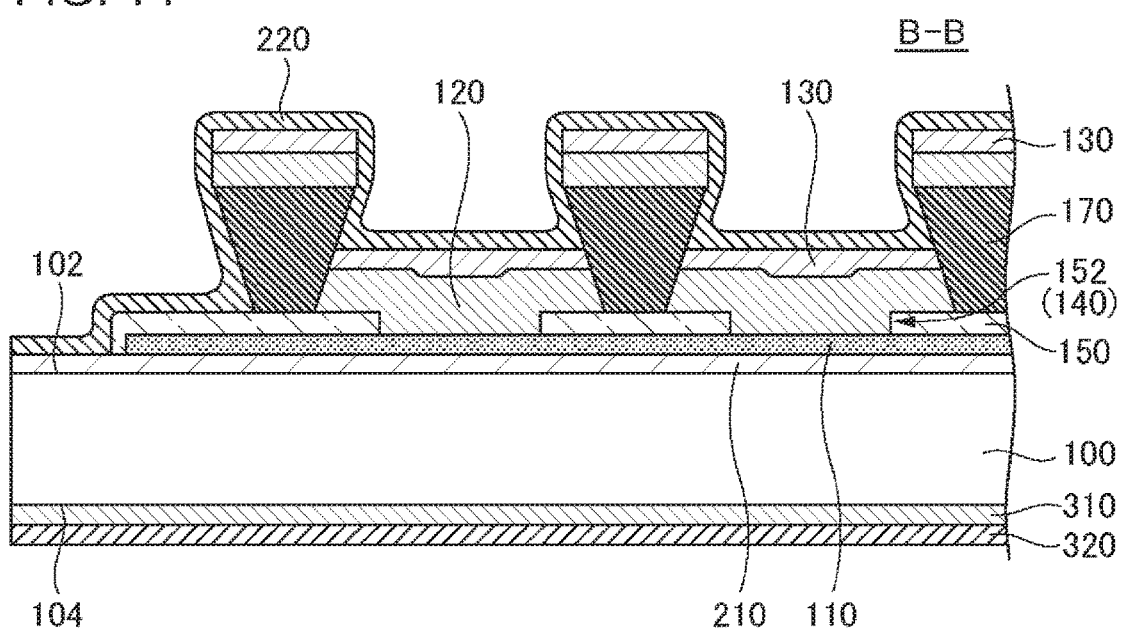
FIG. 14 is a cross-sectional view taken along line B-B of FIG. 12.
Figure 15:
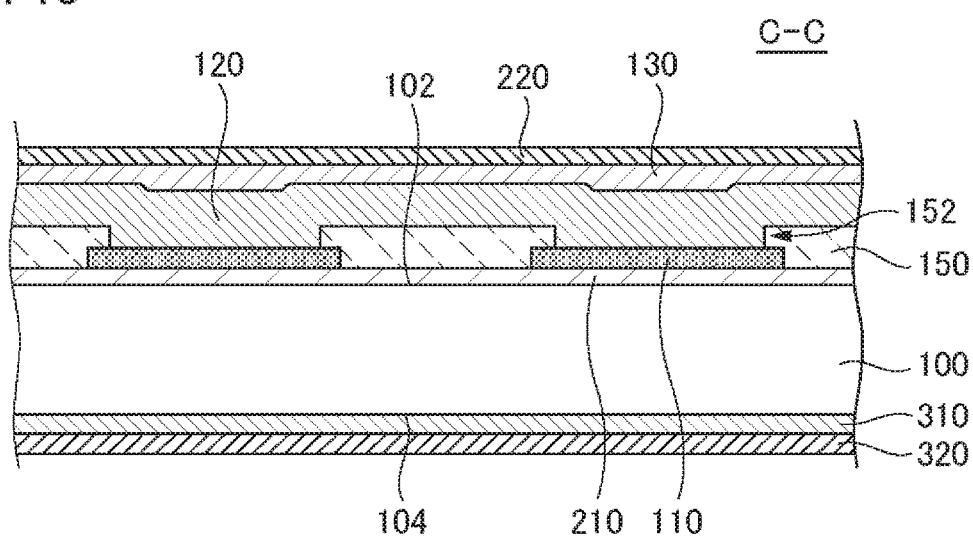
FIG. 15 is a cross-sectional view taken along line C-C of FIG. 12.
Figure 16:
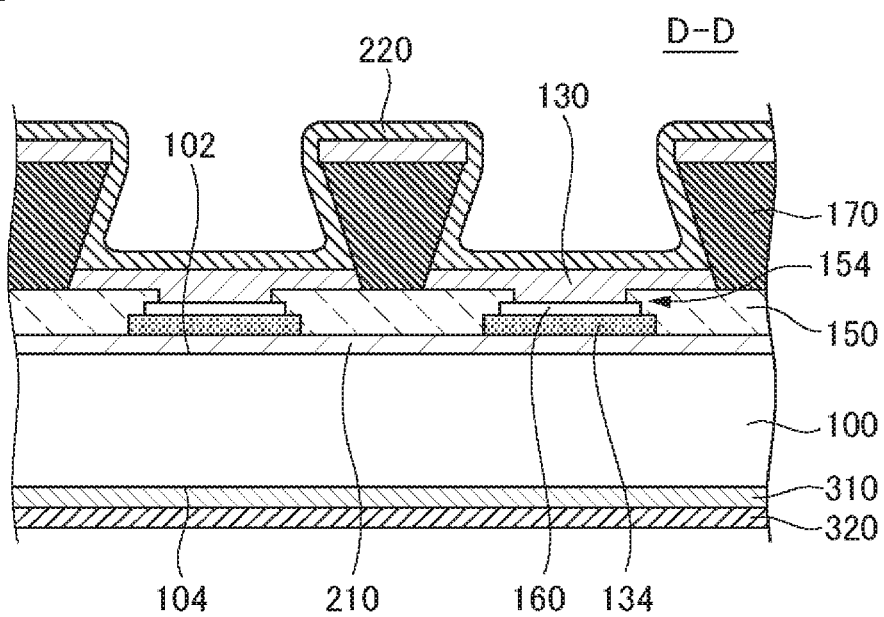
FIG. 16 is a cross-sectional view taken along line D-D of FIG. 12.

FIG. 12 is a plan view of a light-emitting device 10 according to Example 2. For ease of explanation, in FIG. 12, a second stacked film 220 is indicated by a dotted line. FIG. 13 is a diagram in which a partition wall 170, a second electrode 130, an organic layer 120, and an insulating layer 150 are removed form FIG. 12. FIG. 14 is a cross-sectional view along line B-B of FIG. 12, FIG. 15 is a cross-sectional view along line C-C of FIG. 12, and FIG. 16 is a cross-sectional view along line D-D of FIG. 12.

The light emitting device 10 according to the present embodiment is a display including a substrate 100, a first electrode 110, a light-emitting unit 140, an insulating layer 150, plural openings 152, plural openings 154, plural extraction interconnects 114, an organic layer 120, a second electrode 130, plural extraction interconnects 134, and plural partition walls 170.

The first electrode 110 extends linearly in the first direction (in the Y direction in FIG. 12). An end of the first electrode 110 is connected to the extraction interconnect 114.

The extraction interconnect 114 is for connecting the first electrode 110 to the first terminal 112. In an example shown in the drawing, a one end side of the extraction interconnect 114 is connected to the first electrode 110 and the other end side of the extraction interconnect 114 serves as the first terminal 112. In the example shown in the drawing, the first electrode 110 and the extraction interconnect 114 are integral. A conductive layer 160 is formed on the extraction interconnect 114. The conductive layer 160 is formed using a material having resistance lower than that of the first electrode 110, and is, for example, Al. Meanwhile, the conductive layer 160 may have a multilayer structure. A part of the extraction interconnect 114 is covered by the insulating layer 150.

The insulating layer 150 is, as shown in FIG. 12, and FIG. 14 to FIG. 16, formed on plural first electrodes 110 and also in regions therebetween. Plural openings 152 and plural openings 154 are formed in the insulating layer 150. Plural second electrodes 130 extend in parallel to each other in a direction intersecting the first electrodes 110 (for example, a direction orthogonal to X direction in FIG. 12). The partition wall 170, to be explained in detail later, extends between the plural second electrodes 130. Specifically, the plural openings 152 are aligned in a direction in the extending direction of the first electrodes 110 (Y direction in FIG. 12). Moreover, the plural openings 152 are also aligned in the extending direction of the second electrodes 130 (X direction in FIG. 12). Therefore, the plural openings 152 are disposed so as to constitute a matrix.

The openings 154 are located in a region overlapping a one end side of each of the plural second electrodes 130 when seen in a planar view. In addition, the openings 154 are disposed along one side of the matrix constituted by the openings 152. When seen in a direction along this one side (for example, Y direction in FIG. 12, that is, a direction along the first electrodes 110), the openings 154 are disposed at a predetermined interval. A portion of the extraction interconnects 134 are exposed from the openings 154. The extraction interconnects 134 are connected to the second electrodes 130 through the openings 154.

The extraction interconnect 134 is for connecting the second electrode 130 to the second terminal 132 and includes a layer constituted of the same material as that of the first electrode 110. A one end side of the extraction interconnect 134 is located below the opening 154, and the other end side of the extraction interconnect 134 is extracted to the outside of the insulating layer 150. In an example shown in FIG. 12, the other end side of the extraction interconnect 134 serves as the second terminal 132. The conductive layer 160 is formed on the extraction interconnect 134. Meanwhile, a portion of the extraction interconnect 134 is covered by the insulating layer 150.

The organic layer 120 is formed in a region overlapping the openings 152. A hole injection layer of the organic layer 120 is in contact with the first electrode 110, and an electron injection layer of the organic layer 120 is in contact with the second electrode 130. Therefore, the light-emitting unit 140 is located in each region overlapping the opening 152.

Meanwhile, in each of examples shown in FIG. 14 and FIG. 15, each layer configuring the organic layer 120 protrudes to the outside of the opening 152. As shown in FIG. 12, the organic layer 120 may or may not be continuously formed between the neighboring openings 152 in the extending direction of the partition wall 170. However, as shown in FIG. 16, the organic layer 120 is not formed over the openings 154.

The second electrode 130 extends in a second direction (X direction in FIG. 12) intersecting the first direction as illustrated in FIG. 12 and FIG. 14 to FIG. 16. The partition wall 170 is formed between the neighboring second electrodes 130. The partition wall 170 extends in parallel to the second electrode 130, that is, in the second direction. The foundation of the partition wall 170 is, for example, the insulating layer 150. The partition wall 170 is a photosensitive resin such as, for example, a polyimide-based resin and the like, formed in a predetermined pattern by undergoing exposure and development. Meanwhile, the partition wall 170 may also be constituted of a resin, for example, an epoxy resin or an acrylic resin which are not polyimide-based, or an inorganic material such as a silicon dioxide or the like.

The cross-sectional shape of the partition wall 170 is a trapezoid turned upside down (an inverted trapezoid). That is, the width of the upper surface of the partition wall 170 is larger than the width of the lower surface thereof. For this reason, when the partition walls 170 are formed before the second electrodes 130, plural second electrodes 130 can be formed at one time on one surface side of the substrate 100 by vapor deposition or sputtering. Moreover, the partition walls 170 have a function of partitioning the organic layer 120.

Also in the present example, the first stacked film 210 and the second stacked film 220 are formed on the first surface 102 of the substrate 100, and the third stacked film 310 and the fourth stacked film 320 are formed on the second surface 104 of the substrate 100. The second stacked film 220 seals the light-emitting unit 140. Meanwhile, in the present example, the first terminal 112 and the second terminal 132 are disposed along the same side of the substrate 100. For this reason, in the second stacked film 220, an opening for exposing the first terminal 112 and an opening for exposing the second terminal 132 are connected to each other.

Next, a method of manufacturing the light-emitting device 10 in the present example is explained. First, the first stacked film 210 and the third stacked film 310 are formed on the substrate 100. These manufacturing steps are as shown in the embodiment.

Next, the first electrode 110, the extraction interconnect 114, and the extraction interconnect 134 are formed on the first surface 102 of the substrate 100. The conductive layer 160 is thereafter formed on the interconnect 114 and the interconnect 134. Next, the insulating layer 150 is formed, and moreover, the partition wall 170 is formed. The organic layer 120 and the second electrode 130 are then formed. These manufacturing steps are the same as Example 1.

Next, the second stacked film 220 and the fourth stacked film 320 are formed over the substrate 100. These manufacturing steps are as shown in the embodiment.

According to the present example, as with the embodiment, stress applied to the substrate 100 can be reduced in the display that utilizes the light-emitting unit 140.

The embodiments and the examples are described above referring to the drawings, but these are examples of the present invention and various configurations other than those described above can be employed.

The invention claimed is:

1. A light-emitting device comprising:
   a substrate comprising a resin material;
   a first stacked film formed on a first surface of the substrate and comprising a plurality of stacked layers, wherein the first stacked film is a stacked film formed by repeatedly stacking a first layer and a second layer a plurality of times,
      wherein the second layer has a material different from that of the first layer, and
      wherein at least one of the first layer is thicker than another first layer and the second layers;
   a light-emitting unit formed on the first stacked film and comprising an organic layer;
   a second stacked film covering the light-emitting unit and comprising a plurality of stacked layers;
   a third stacked film formed on a second surface of the substrate and comprising a plurality of stacked layers;
   a fourth stacked film formed overlapping the third stacked film and comprising a plurality of stacked layers,
   wherein the number of layers of the third stacked film is the same as that of the first stacked film, and materials of respective ones of the plurality of layers constituting the third stacked film are the same as materials of respective ones of the plurality of layers of the first stacked film positioned in a laminating order corresponding to a laminating order of the third stacked film when counted from the substrate side, and
   wherein the number of layers of the fourth stacked film is the same as that of the second stacked film, and materials of respective ones of the plurality of layers constituting the fourth stacked film are the same as materials of respective ones of the plurality of layers of the fourth stacked film positioned in a laminating order corresponding to a laminating order of the fourth stacked film when counted from the substrate side.

2. The light-emitting device according to claim 1,
   wherein when counted from the substrate side, the third stacked film is the same as the first stacked film, and the fourth stacked film is the same as the second stacked film.

3. The light-emitting device according to claim 1,
   wherein the second stacked film is thicker than the first stacked film, and the fourth stacked film is thicker than the third stacked film.

4. The light-emitting device according to claim 1, wherein all the plurality of the stacked layers in the first stacked film, all the plurality of the stacked layers in the second stacked film, all the plurality of the stacked layers in the third stacked film, and all the plurality of the stacked layers in the fourth stacked film are inorganic films.

5. A light-emitting device comprising:
   a first stacked film comprising a plurality of stacked layers, a light-emitting unit comprising an organic layer, and a second stacked film comprising a plurality of stacked layers, wherein the first stacked film, the light-emitting unit, and the second stacked film are on a first surface of a substrate comprising a resin material in this order,
   wherein the first stacked film is a stacked film formed by repeatedly stacking a first layer and a second layer a plurality of times,
   wherein the second layer has a material different from that of the first layer,
   wherein at least one or the first layer s thicker than another first layer and the second layers,
   a third stacked film comprising a plurality of stacked layers, and a fourth stacked film comprising a plurality of stacked layers, wherein the third stacked film and the fourth stacked film are on a second surface of the substrate in this order,
   wherein each of the plurality of stacked layers of the third stacked film contains the same material as each of the plurality of layers of the first stacked film, and the plurality of layers of the third stacked film are in the same order with the plurality of layers of the first stacked film when counted from the substrate,
   wherein each of the plurality of stacked layers of the fourth stacked film contains the same material as each of the plurality of layers of the second stacked film, and the plurality of layers of the fourth stacked film are in the same order with the plurality of layers of the second stacked film when counted from the substrate.

6. The light emitting device according to claim 5,
   wherein the number of layers of the third stacked film is the same as that of the first stacked film, and the number of layers of the fourth stacked film is the same as that of the second stacked film.

* * * * *